(12) United States Patent
Jiang et al.

(10) Patent No.: US 8,307,323 B2
(45) Date of Patent: Nov. 6, 2012

(54) METHOD FOR ANALOG PLACEMENT AND GLOBAL ROUTING CONSIDERING WIRING SYMMETRY

(75) Inventors: Iris Hui-Ru Jiang, Yonghe (TW); Yu-Ming Yang, Xindian (TW)

(73) Assignee: National Chiao Tung University, Hsinchu (TW)

( * ) Notice: Subject to any disclaimer, the term of this patent is extended or adjusted under 35 U.S.C. 154(b) by 286 days.

(21) Appl. No.: 12/824,942

(22) Filed: Jun. 28, 2010

(65) Prior Publication Data
US 2011/0276936 A1 Nov. 10, 2011

(30) Foreign Application Priority Data

May 10, 2010 (TW) .............................. 99114823 A

(51) Int. Cl.
*G06F 17/50* (2006.01)
(52) U.S. Cl. ......... 716/132; 716/119; 716/126; 716/129
(58) Field of Classification Search ........................ None
See application file for complete search history.

(56) References Cited

U.S. PATENT DOCUMENTS

| | | | |
|---|---|---|---|
| 7,178,123 B2 | 2/2007 | Lin et al. | |
| 7,739,646 B2 * | 6/2010 | Lin et al. ........................ | 716/119 |
| 7,823,116 B2 * | 10/2010 | Chan .............................. | 716/104 |
| 7,873,928 B2 * | 1/2011 | Lin et al. ........................ | 716/119 |
| 2007/0022399 A1 | 1/2007 | Tsai et al. | |
| 2008/0092099 A1 | 4/2008 | Lin et al. | |

OTHER PUBLICATIONS

Chang et al., "NTHU—Route 2.0: A Fast and Stable Global Router," 2008 ICCAD, pp. 338-343.*
Cho et al., "BoxRouter: A New Global Router Based on Box Expansion and Progressive ILP," IEEE Trans. on CAD of ICs & Systems, vol. 26, No. 12, Dec. 2007, pp. 2130-2143.*
Chu et al., "Fast and Accurate Rectilinear Steiner Minimal Tree Algorithm for VLSI Design," 2005 ACM-ISPD, pp. 28-35.*
Chu, "FLUTE: Fast Lookup Table Based Wirelength Estimation Technique," 2004 IEEE, pp. 696-701.*
Cohn et al., "KOAN/ANAGRAM II: New Tools for Device-Level Analog Placement and Routing," IEEE J. of Solid-State Circuits, vol. 26, No. 3, Mar. 1991, pp. 330-342.*
Gao et al., "A New Global Router for Modern Designs," 2008 IEEE, pp. 232-237.*
Jerke et al., "Constraint-driven Design—The Next Step Towards Analog Design Automation," 2009 ACM-ISPD, pp. 75-82.*
Lin et al., "Thermal-driven Analog Placement Considering Device Matching," 2009 ACM-DAC, pp. 593-598.*

(Continued)

*Primary Examiner* — Leigh Garbowski
(74) *Attorney, Agent, or Firm* — Muncy, Geissler, Olds & Lowe, PLLC

(57) ABSTRACT

A method for analog placement and global routing considering wiring symmetry performs a layout for a circuit which is described by a netlist having a set of devices and wires. First, the method inputs the netlist, and each device thereof has a design constraint and a corresponding priority. Based on the priorities, it performs a sorting on the devices to establish a constraint library. Then, based on the design constraint and corresponding priority of each device, the method establishes a hierarchical constraint tree. According to the hierarchical constraint tree, the method performs placement of each device, wherein possible shape of each device is represented by a shape curve. For each placement of the device, the method calculates a corresponding cost function. Then, it selects an optimum placement of the device according to the cost functions. The method establishes an RSMT for each wire and then performs an analog routing.

13 Claims, 12 Drawing Sheets

OTHER PUBLICATIONS

Ma et al., "Analog Placement with Common Centroid Constraints," 2007 IEEE, pp. 579-585.*

Mehranfar, "A Technology-Independent Approach to Custom Analog Cell Generation," IEEE J. of Sold-State Circuits, vol. 26, No. 3, Mar. 1991, pp. 386-393.*

Nassaj et al., "A New Methodology for Constraint-Driven Layout Design of Analog Circuits," 2009 IEEE, pp. 996-999.*

Nassaj et al., "A Constraint-Driven Methodology for Placement of Analog and Mixed-Signal Integrated Circuits," 2008 IEEE, pp. 770-773.*

Pan et al., "FastRoute 2.0: A High-quality and Efficient Global Router," 2007 IEEE, pp. 250-255.*

Pan et al., "FastRoute: A Step to Integrate Global Routing into Placement," 2006 ACM-ICCAD, pp. 464-471.*

Xiao et al., "Analog Placement with Common Centroid and 1-D Symmetry Constraints," 2009 IEEE, pp. 353-360.*

Yan et al., "DeFer: Deferred Decision Making Enabled Fixed-Outline Floorplanning Algorithm," IEEE Trans. on CAD of ICs & Systems, vol. 29, No. 3, Mar. 2010, pp. 367-381.*

Yan et al., "DeFer: Deferred Decision Making Enabled Fixed-Outline Floorplanner," 2008 ACM-DAC, pp. 161-166.*

Martin Strasser, Michael Eick, Helmut Grab, Ulf Schlichtmann, and Frank M. Johannes; Deterministic Analog Circuit Placement Using Hierarchically Bounded Enumeration and Enhanced Shape Functions; *2008 IEEE*; p. 306-p. 313.

Po-Hung Lin, Ho-Che Yu, Tian-Hau Tsai, and Shyh-Chang Lin; A Matching-Based Placement and Routing System for Analog Design; *2007 IEEE*, (no page numbers).

Po-Hung Lin and Shyh-Chang Lin; Analog Placement Based on Novel Symmetry-Island Formulation; p. 465-p. 470; San Diego, CA, U.S.A.

Po-Hung Lin and Shyh-Chang Lin; Analog Placement Based on Hierarchical Module Clustering; *DAC 2008*; p. 50-p. 55; Anaheim, California, U.S.A.

Yu-Ming Yang and Iris Hui-Ru Jiang; Analog Placement and Global Routing Considering Wiring Symmetry; *Proceedings of the Eleventh International Symposium on Quality Electronic Design ISQED 2010*, Mar. 22-24, 2010; p. 618-p. 623; San Jose, California, U.S.A.

\* cited by examiner

```
**********op amp**********
M1   net1  vi+  net2  gnd  nch  L=1u  W=10u    m=12  *symmetry1 proximity1
M2   net3  vi-  net2  gnd  nch  L=1u  W=10u    m=12  *symmetry1 proximity1
M3   vo-   vb3  net1  net1 pch  L=1u  W=20u    m=16  *symmetry2 proximity2
M4   vo+   vb3  net3  net3 pch  L=1u  W=20u    m=16  *symmetry2 proximity2
M5   net1  vb4  vdd   vdd  pch  L=1u  W=20u    m=20  *symmetry3 proximity2
M6   net3  vb4  vdd   vdd  pch  L=1u  W=20u    m=20  *symmetry3 proximity2
M7   vo-   vb2  net4  gnd  nch  L=1u  W=9.75u  m=13  *symmetry4 proximity2
M8   vo+   vb2  net5  gnd  nch  L=1u  W=9.75u  m=13  *symmetry4 proximity2
M9   net4  vb1  gnd   gnd  nch  L=1u  W=9.45u  m=12  *symmetry5 proximity2
M10  net5  vb1  gnd   gnd  nch  L=1u  W=9.45u  m=12  *symmetry5 proximity2
M11  net2  vb0  gnd   gnd  nch  L=1u  W=10u    m=14  *proximity1
```

FIG. 3

| Type | input | differential | mirroring | matching |
|---|---|---|---|---|
| Priority | 6 | 5 | 4 | 3 |
| Type | proximity | power | others | |
| Priority | 2 | 1 | 0 | |

FIG. 4

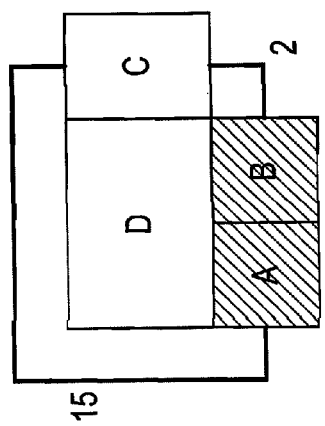
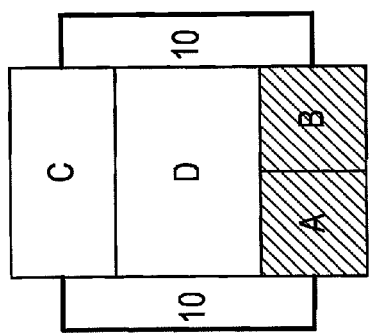
FIG. 10

METHOD FOR ANALOG PLACEMENT AND GLOBAL ROUTING CONSIDERING WIRING SYMMETRY

BACKGROUND OF THE INVENTION

1. Field of the Invention

The present invention relates to the technical field of analog layout and, more particularly, to a method for analog placement and global routing considering wiring symmetry.

2. Description of Related Art

Analog designs are quite different from digital designs from a layout perspective. Unlike a large-scale digital design, an analog design usually has a relatively small scale, i.e., an analog circuit typically has a relatively small die size. However, its physical behavior is very sensitive to the layout geometry, e.g., parasitic coupling effect, small signal transmission, wiring crossovers, etc. Hence, area minimization is usually not a concern for an analog design. A digital designer can leverage mature commercial EDA tools to automate layout generation. However, the existing and popular way to generate an analog layout is far from automatic. The manual, time-consuming, error-prone task highly depends on the layout designer's experience and wit. However, analog design automation has become desirable.

To facilitate the automatic analog layout generation, the designer's expertise can be translated to topological constraints. Three symmetry constraints, i.e., device matching, device mirroring, and device proximity constraints, for analog device placement are proposed in the prior art.

The device matching constraint is created for the devices that can share common gate or should be placed closely. The device mirroring constraint is used on two devices that have to be placed symmetrically to avoid parasitic mismatches. For the devices with the same functionality, the device proximity constraint restricts them to be placed together.

The parasitic mismatch between two devices can be minimized by the device matching constraint, the device mirroring constraint, and the device proximity constraint cited above. Nevertheless, if the signal paths going out of and coming into the symmetry constrained modules are not symmetric, the signal still mismatches and may cause the circuit failure. Therefore, for the analog design automation, the prior works only consider the device symmetry and neglect wiring symmetry. FIG. 1 is a schematic view of two typical analog layouts, which demonstrates the importance of the wiring symmetry. As shown in FIG. 1, devices A and B have the device mirroring constraint, and they are placed symmetrically. They both connect to device C. FIG. 1(a) shows a placement topology with wire asymmetry, while FIG. 1(b) shows a placement topology with wire symmetry. It can be seen in FIG. 1(a) and FIG. 1(b) that the symmetry depends not only on symmetric devices but also on the devices that they connect, because the asymmetric placement induces asymmetric wiring, leading to different physical behaviors for symmetric devices. As shown in FIG. 1(c) and FIG. 1(d), although mirroring devices A and B are placed symmetrically with their common connected device C, careless routing may distort the symmetry. Obviously, compared with FIG. 1(c), the topology in FIG. 1(d) is symmetric on both placement and routing. The previous works have emphasized only on device (placement) symmetry, but the wiring (routing) in an analog circuit can cause the physical effect to impact on the circuit performance. Therefore, only device symmetry consideration is not enough. If the wiring symmetry is neglected at layout, it causes unbalanced physical behavior to these symmetric devices and cannot achieve the symmetric layout.

Therefore, it is desirable to provide an improved method for analog placement and global routing considering wiring symmetry to mitigate and/or obviate the aforementioned problems.

SUMMARY OF THE INVENTION

The object of the present invention is to provide a method for analog placement and global routing considering wiring symmetry, which allows the analog placement and global routing design to maintain both device symmetry and wiring symmetry to further increase the analog signal quality and decrease the mismatch between two devices in process.

According to a feature of the invention, a method for analog placement and global routing considering wiring symmetry is provided, which is executed in a computer to perform a layout for an analog circuit described by a netlist having a set of devices and wires connected thereon. The method includes the steps of: (A) inputting the netlist, each device of the netlist having a design constraint, each design constraint corresponding to a priority; (B) establishing a hierarchical constraint tree based on the design constraint and corresponding priority of each device; (C) performing a sorting on the devices based on the priorities; (D) performing a placement on each device according to the hierarchical constraint tree, wherein a possible shape of each device is represented by a shape curve; (E) calculating a corresponding cost function for each placement of the device, and selecting an optimum placement of the device according to the cost functions; (F) establishing a rectilinear Steiner minimal tree (RSMT) for each wire; and (G) performing an analog routing.

Other objects, advantages, and novel features of the invention will become more apparent from the following detailed description when taken in conjunction with the accompanying drawings.

BRIEF DESCRIPTION OF THE DRAWINGS

FIG. 3 is a graph of a netlist in accordance with an embodiment of the invention;

FIG. 4 shows the design constraints in accordance with an embodiment of the invention;

FIG. 10 is a schematic diagram of Total_Wiring_Difference in accordance with an embodiment of the invention;

DETAILED DESCRIPTION OF THE PREFERRED EMBODIMENT

Figure 1:
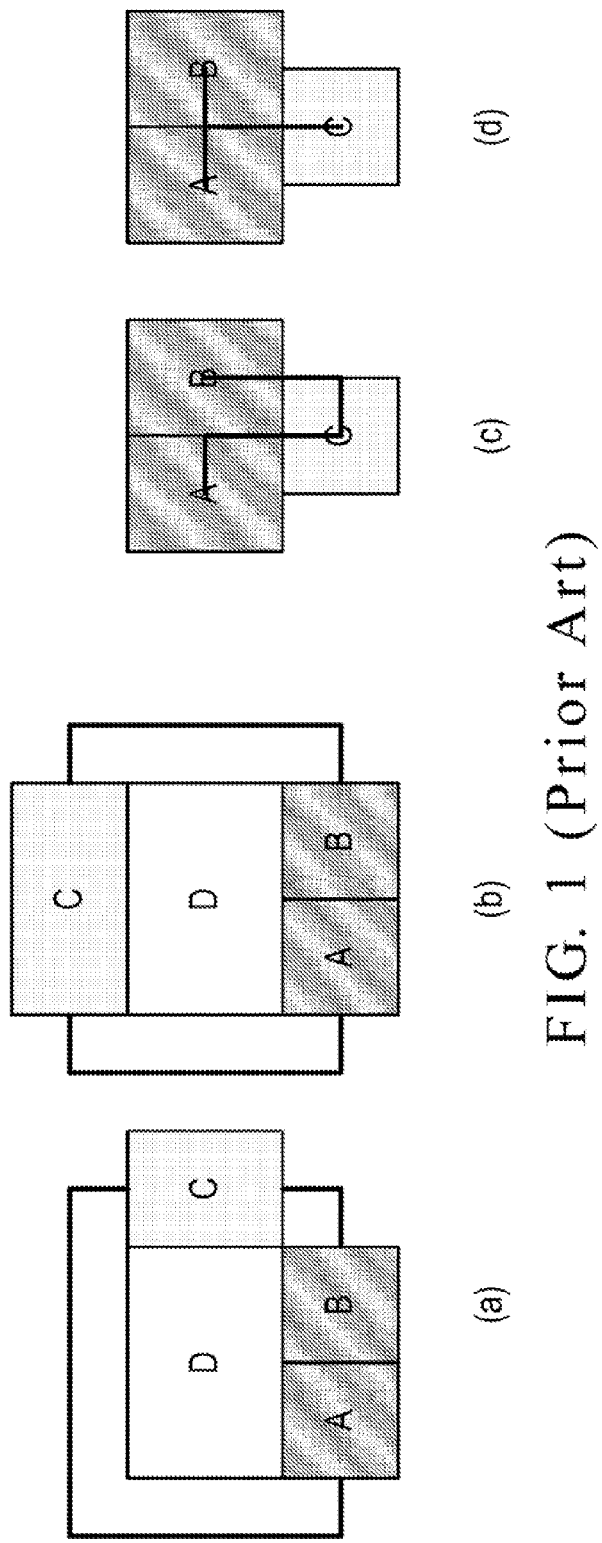
FIG. 1 is a schematic view of two typical analog layouts.
Figure 2:
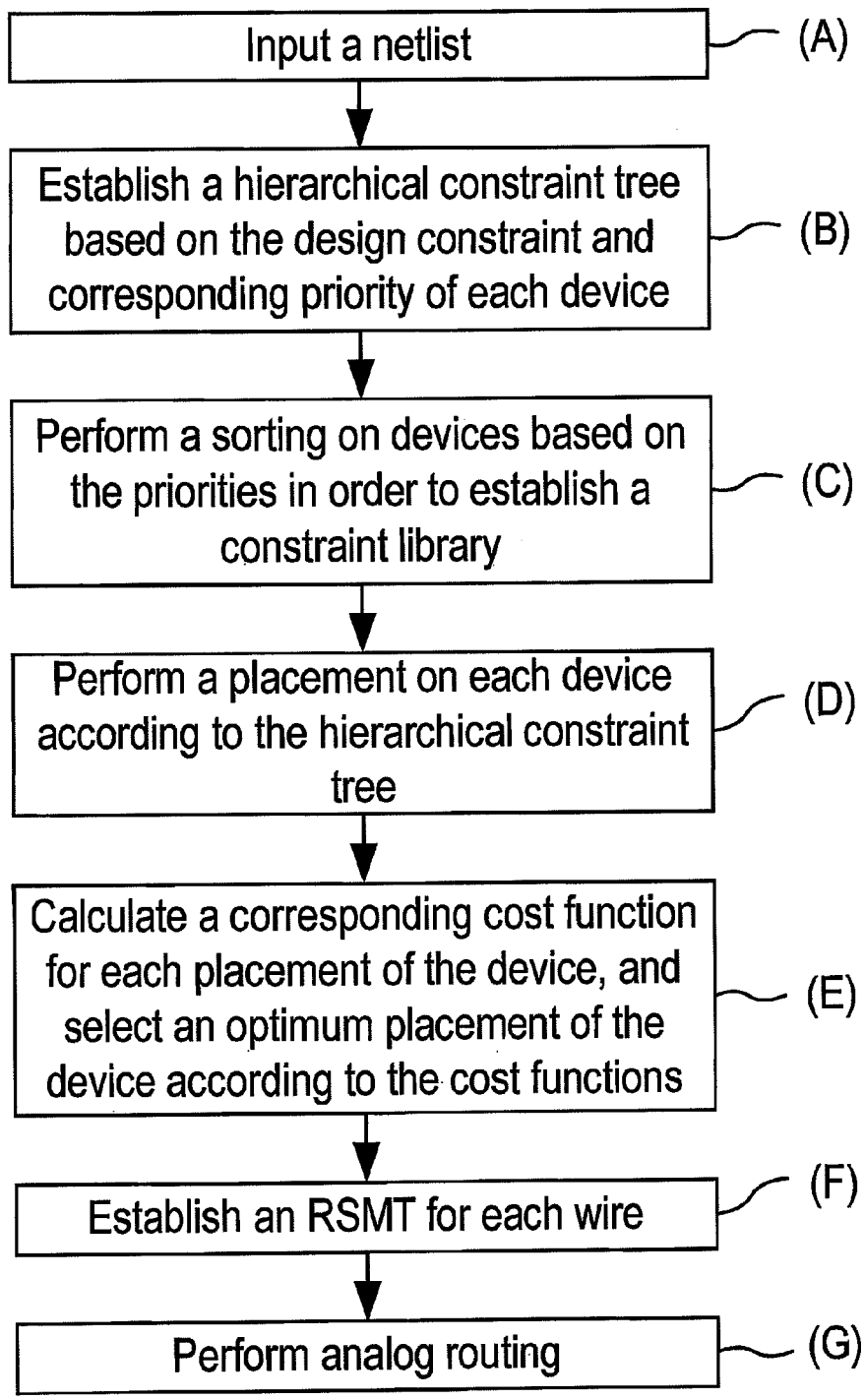
FIG. 2 is a flowchart of a method for analog placement and global routing considering wiring symmetry in accordance with an embodiment of the invention.

FIG. 2 is a flowchart of a method for analog placement and global routing considering wiring symmetry in accordance with an embodiment of the invention. The method is executed in a computer to perform a layout for an analog circuit which is described by a netlist having a set of devices and wires connected thereon. In the method, step (A) is first executed for inputting the netlist, each device of the netlist having a design constraint, each design constraint corresponding to a priority.

FIG. 3 is a graph of a netlist in accordance with an embodiment of the invention. In this embodiment, the netlist is described in Simulation Program with Integrated Circuit (SPICE) format, and the design constraints are annotated into the netlist. The annotations are started with the symbol "*". As shown in FIG. 3, transistor M1 has the design constraints Symmetry1 and Proximity1. The constraints can be done by designers or by automatic pattern recognition.

In other embodiments, the design constraints can be stored in another file other than the SPICE file for the analog circuit.

In other embodiments, step (A) can input the circuit diagram drawn by a schematic circuit layout tool. The circuit diagram has multiple devices and wires connected thereon, and the design constraints of each device can be arranged in an attribute field.

FIG. 4 shows the design constraints in accordance with an embodiment of the invention. As shown in FIG. 4, the types of design constraint include input, differential, mirroring, matching, proximity, power, and others. The design constraints of input, differential, mirroring, matching, proximity, power, and others have priorities of 6, 5, 4, 3, 2, 1 and 0, respectively, wherein the priorities are in descending order, i.e., number 6 is the highest priority and number 0 is the lowest priority.

Step (B) establishes a hierarchical constraint tree based on the design constraint and corresponding priority of each device.

In constraint-driven placement, the circuit analysis is the most important step. In this embodiment, this step builds up the hierarchical constraint tree of an analog circuit and represents each symmetry constrained module as a tree node. The hierarchical constrain tree structure is generated based on the functionalities of the devices.

Accordingly, step (C) performs a sorting on the devices based on the priorities in order to establish a constraint library. When design constraints have identical priority, the alphabetic order is used. For example, when both Proximity2 and Proximity3 are simultaneously existed in the same device, Proximity2 is processed before Proximity3.

Figure 5:
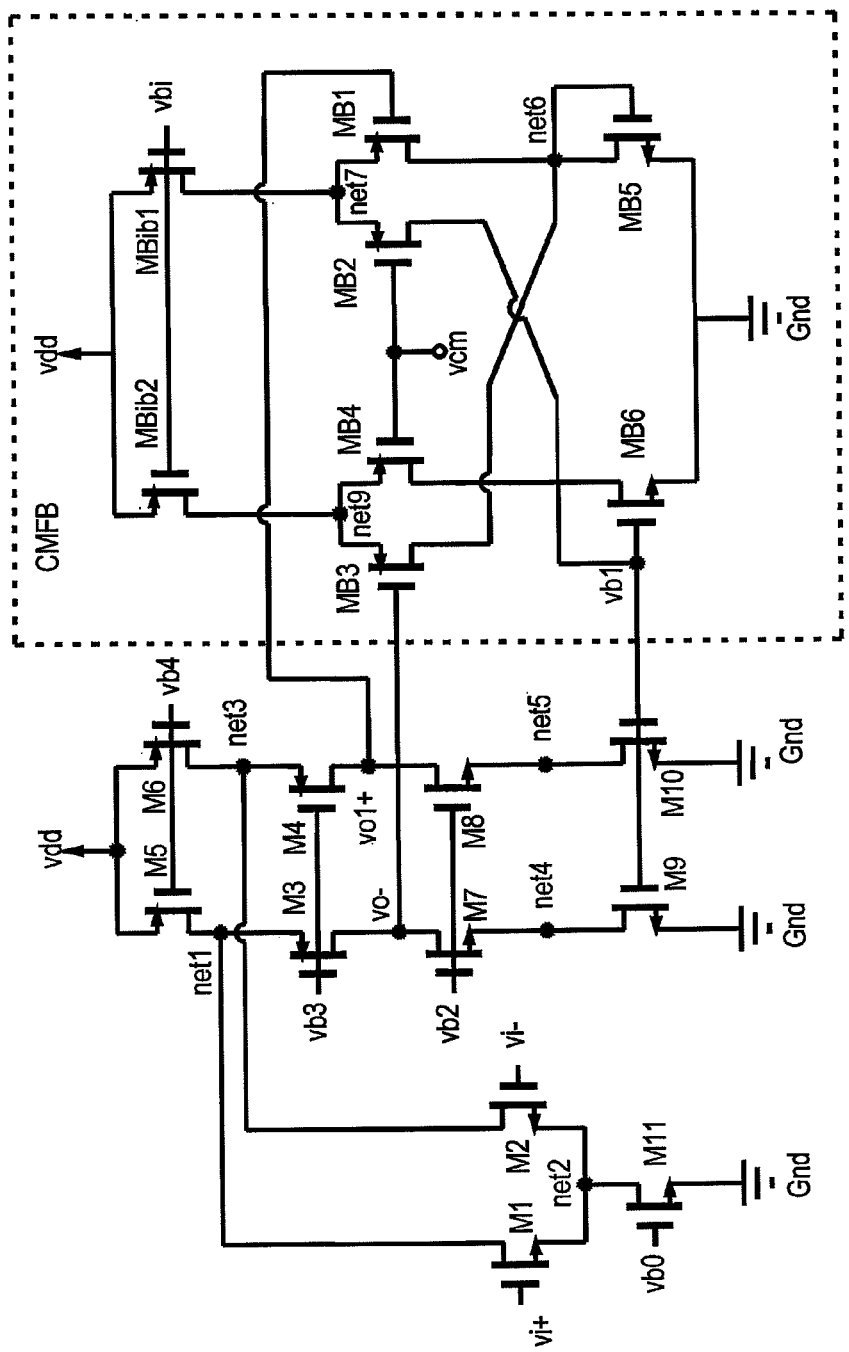
FIG. 5 is a circuit diagram of an operational amplifier in accordance with an embodiment of the invention.
Figure 6:
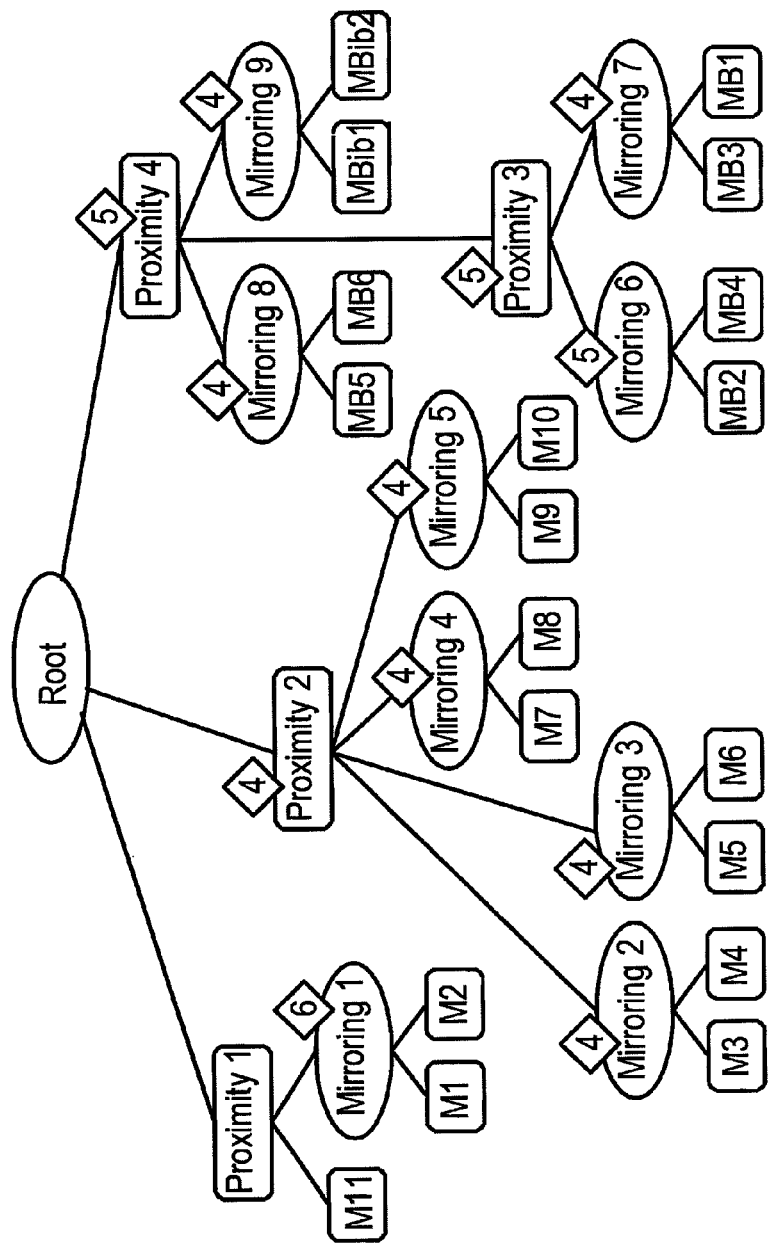
FIG. 6 is a schematic diagram of a hierarchical constraint tree of the operational amplifier of FIG. 5 in accordance with an embodiment of the invention.

FIG. 5 is a circuit diagram of an operational amplifier in accordance with an embodiment of the invention. The operational amplifier can be a folded cascade operational amplifier. FIG. 6 is a schematic diagram of a corresponding hierarchical constraint tree to the operational amplifier of FIG. 5 in accordance with an embodiment of the invention. As shown in FIG. 5, the differential signal passes into devices M1 and M2. Therefore, these two devices have to be constrained by the symmetry constraint and form the input stage.

As shown in FIG. 6, a proximity constraint covers a device mirroring constraint and a device matching constraint. It can be seen in FIG. 5 that using the proximity constraint can tie a symmetry constrained module and its connected devices together, thus considering the wiring symmetry constraint among them.

As shown in FIG. 6, each node in the hierarchical constraint tree is associated with a priority, which is labeled in a diamond-shaped frame attached to each node. A module or device with higher priority is placed earlier than the module or device with lower priority. The priority is propagated upwards to the root. The parent's priority inherits the maximum priority of his descendants.

Step (D) performs a placement on each device according to the hierarchical constraint tree, wherein the possible shapes of each device are represented by a shape curve.

Step (D) first processes the device with input signal, i.e., Mirroring1 in FIG. 6, and places the connected devices in a placement queue based on their connection relationship. The placement order in the queue is based on the priority of each device.

When the connected devices have the same proximity constraint, they are placed directly in the placement queue. For example, transistor M11 and the corresponding Mirroring1 have the same proximity constraint (Proximity 1), M11 and Mirroring1 are thus placed directly in the placement queue.

When the connected devices belong to different proximity constraints, all constrains with the same functionality are placed in the placement queue. For example, Proximity2 is placed in the queue as Mirroring2 connects to Mirroring1. When the priority of a newly placed proximity constraint is higher, the newly placed proximity constraint is placed at the forefront of the queue. Accordingly, the devices with higher priorities are processed first to achieve better device and wiring symmetry.

The dimensions of devices and placement results form a shape curve. Thus, a device folding technique is adopted to increase the flexibility of placement, and possible shapes of each device are represented by a shape curve. The device folding technique can fold up an analog device as a squarer shape.

Device folding can decompose a device of large aspect into small devices of uni-aspect ratio. In addition, the feasible folded dimension is subject to the aspect ratio constraint.

Each folded dimension is regarded as a candidate dimension and memorized as a point in the shape curve. Namely, the shape curve of each device is generated by the device folding technique. In other words, the number of points in a shape curve is decided by the number of feasible folded dimensions.

It is noted that even under the same area, an arbitrary dimension may be infeasible for an analog device, so the number of feasible dimensions is finite and associated with the possible shapes, i.e., the shape curve is naturally discrete.

Figure 7:
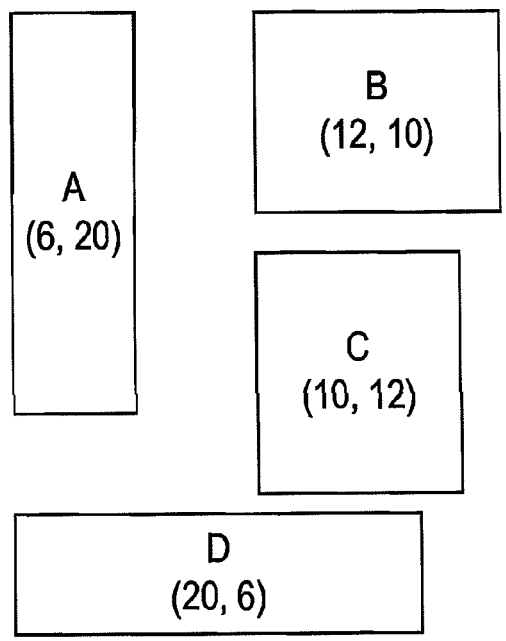
FIG. 7 is a schematic diagram of a device folding in accordance with an embodiment of the invention.
Figure 8:
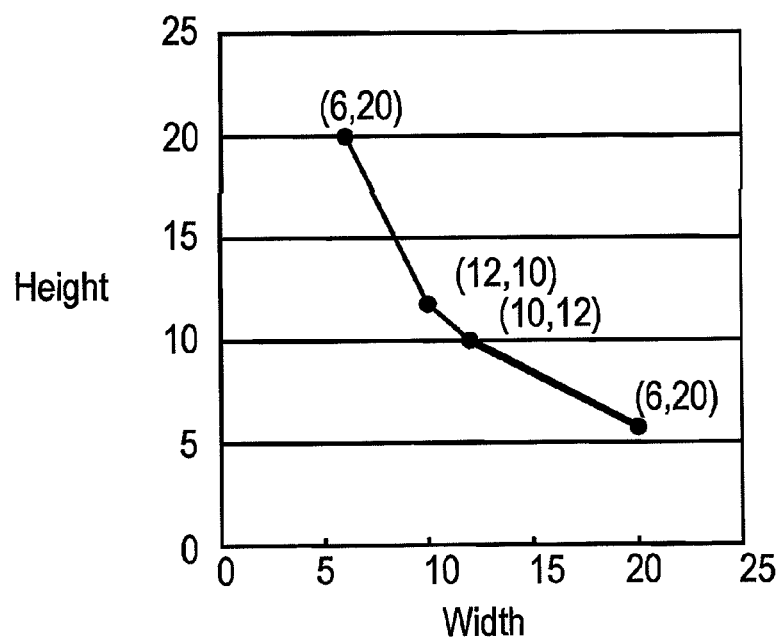
FIG. 8 is a graph of a shape curve generated by performing the device folding of FIG. 7 in accordance with an embodiment of the invention.

FIG. 7 is a schematic diagram of a device folding in accordance with an embodiment of the invention. FIG. 8 is a graph of a shape curve generated by performing the device folding of FIG. 7. Using shape curves can reduce the solution space by pruning redundant solutions. Doing so can increase the flexibility of placement and enhance the symmetry in physical behavior.

In this embodiment, the priority of each device is used as the placement order, i.e., a device with higher priority is placed firstly. When the placement order and possible shape of each device are decided, a placement method is considered. In this embodiment, a force-directed method is used to place each device.

This embodiment applies the absolute coordinate because each device is placed to a certain position to minimize the wiring difference. The ideal position of a newly encountered device or a constrained module is decided by a force directed method considering its connections.

The ideal position is usually at the center of the current partial placement. The next step is legalization, pushing the newly placed device/module along one direction until no overlapping. Because the contours of placed devices are different in four directions, the legalization of the newly placed device/module considers four directions sequentially. The matching module is pre-placed before being added into the layout.

Figure 9:
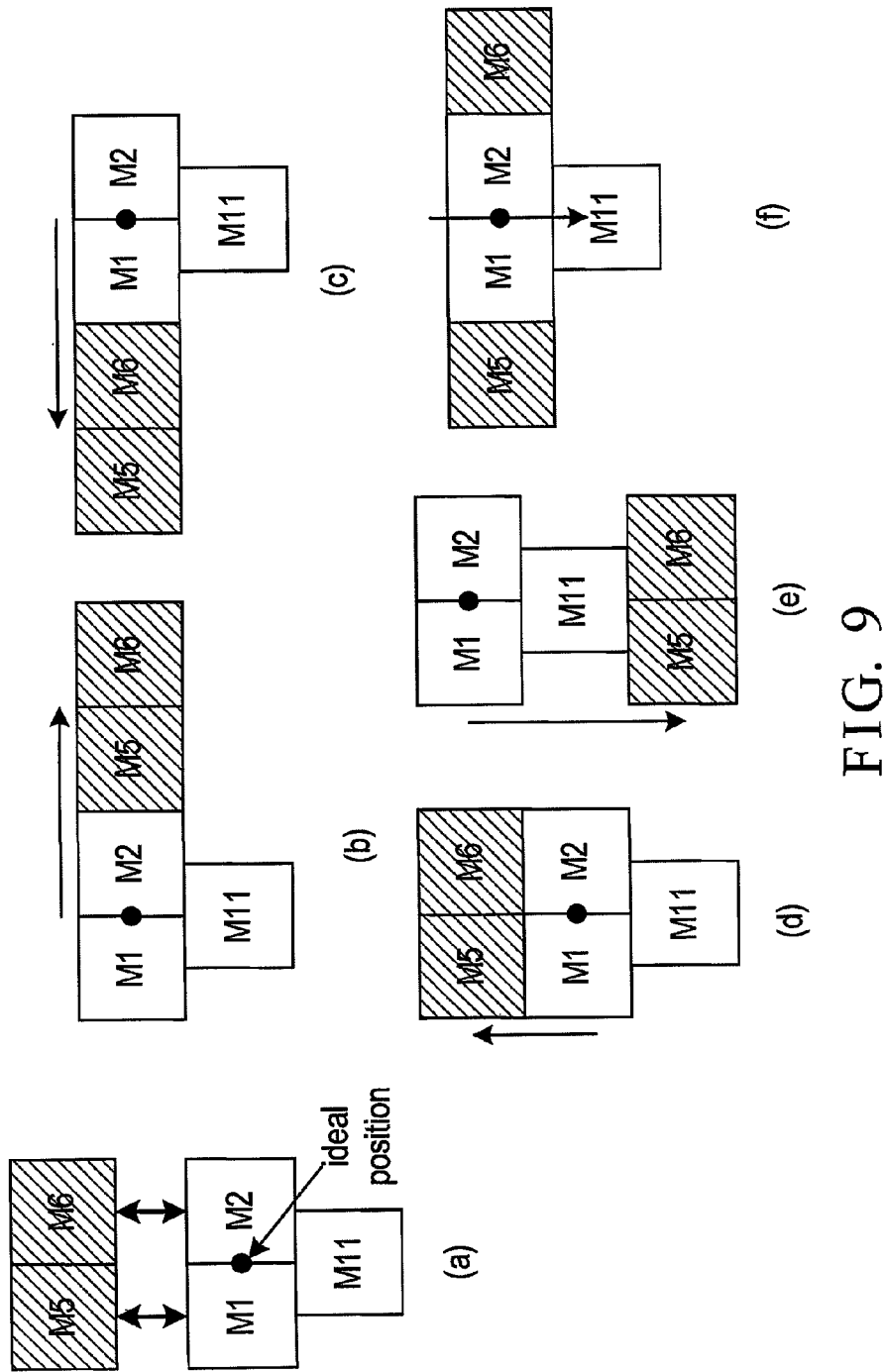
FIG. 9 is a schematic diagram of force-directed placement in accordance with an embodiment of the invention.

FIG. 9 is a schematic diagram of force-directed placement in accordance with an embodiment of the invention. As shown in FIG. 9, M5 and M6 are newly placed devices, and M1, M2, and M11 are placed devices. As shown in FIGS. 9(b)-(e), the ideal positions are calculated by the force-direction method considering the connections, and the devices M5 and M6 are pushed along the four directions until no overlapping.

Since each point in the shape curve represents the possible shape of a device, the above operation is applied to each point (i.e., the possible shapes) in the shape curve. Due to the placement symmetry, a flipping approach can be applied to save the required computation time.

As shown in FIG. 9(f), the fifth placement is selected for the mirror module. Due to the symmetry of the mirror module, the placement is more flexible.

Step (E) calculates a corresponding cost function for each placement of the device, and selects an optimum placement of the device according to the cost functions.

The cost function for each placement of the device is defined as follows:

$$\text{Cost}(P) = \alpha \times (1 + \text{Total\_Wiring\_Difference}) \times \text{Wirelength} + \text{Aspect\_Ratio} \times \text{Layout\_Area},$$

where $\alpha$ is used to balance a weight between wire length and area, and Total_Wiring_Difference is used to estimate wiring symmetry. The cost is increased as Total_Wiring_Difference increasing, which indicates that the placement result does not guarantee the wiring symmetry. The Wirelength is an estimate of total wire length, and in this case Manhattan distance is used to estimate the wire length. Aspect_Ratio is a ratio of length and width. Layout_Area represents layout area. FIG. 10 is a schematic diagram of Total_Wiring_Difference in accordance with an embodiment of the invention. As shown in FIG. 10, the wiring symmetry is better as Total_Wiring_Difference is smaller.

Figure 11:
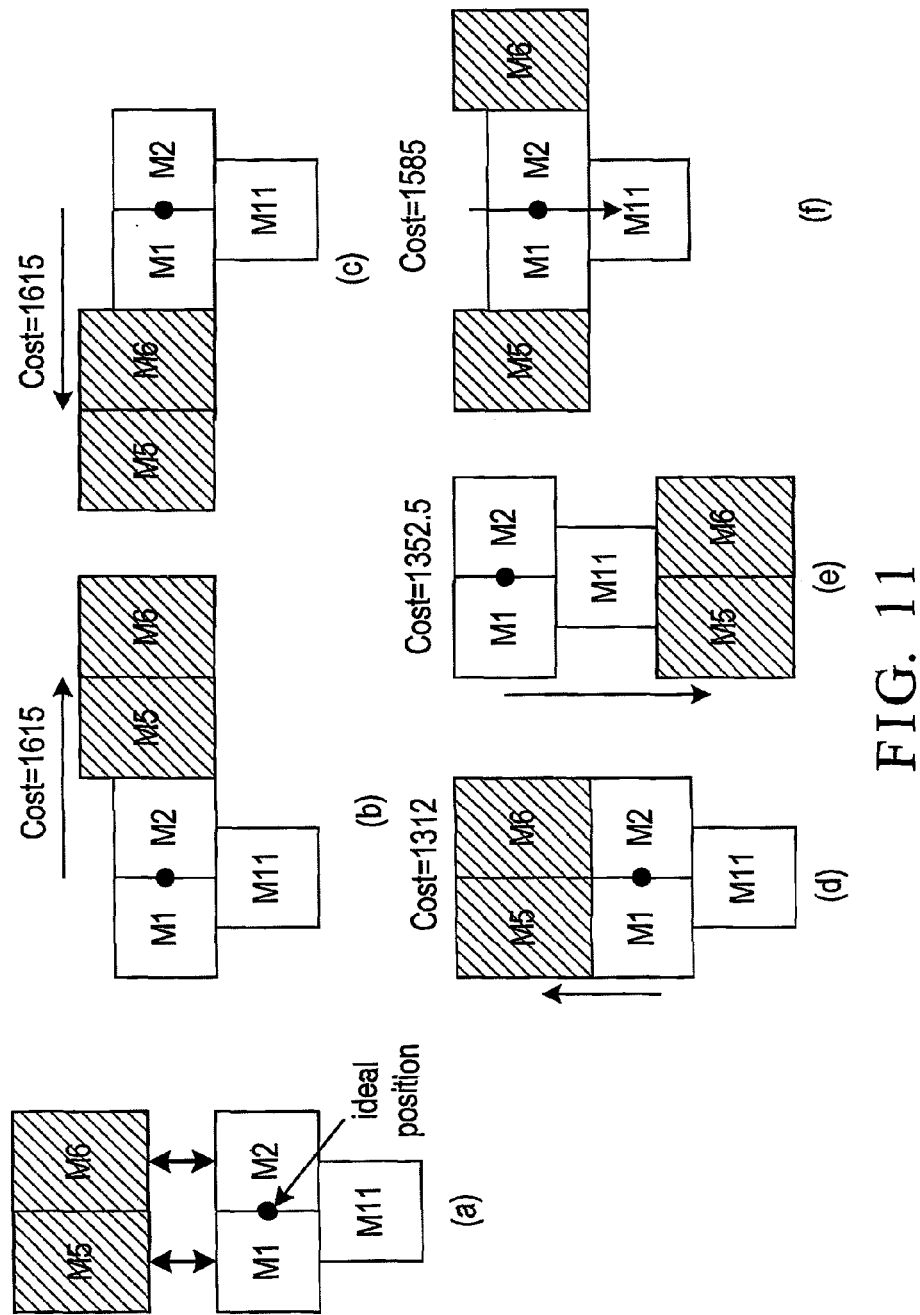
FIG. 11 is a schematic diagram of a cost function for the placement of FIGS. 9(b)-(f) in accordance with an embodiment of the invention.

FIG. 11 is a schematic diagram of a cost function for the placement of FIGS. 9(b)-(f) in accordance with an embodiment of the invention. As shown in FIG. 11, the data shows that, due to the wiring difference, the cost is higher when both M5 and M6 are placed at left or right side. Cost=1585 when M5 and M6 are placed at both sides, which is not obviously advantageous because M5 and M6 have different sizes than M1 and M2 so that the wire length is longer than the wire length of M5 and M6 placed at the upper. The cost where both M5 and M6 are placed at the upper is relatively preferred among the placement topologies in FIG. 11.

Step (F) establishes a rectilinear Steiner minimal tree (RSMT) for each wire. The RSMT is commonly used for routing. The RSMT for each routing point is established, and all routing points are connected by another routing method.

Step (G) performs an analog routing by a pattern routing and then a maze routing on the remaining wires which cannot be routed by the pattern routing.

Before routing, a wiring symmetry analysis is performed on each wire, which is based on a constraint library to sum the priorities of connected devices to each wire so as to generate a corresponding routing weight and thus perform the routing based on the routing weight.

Figure 12:
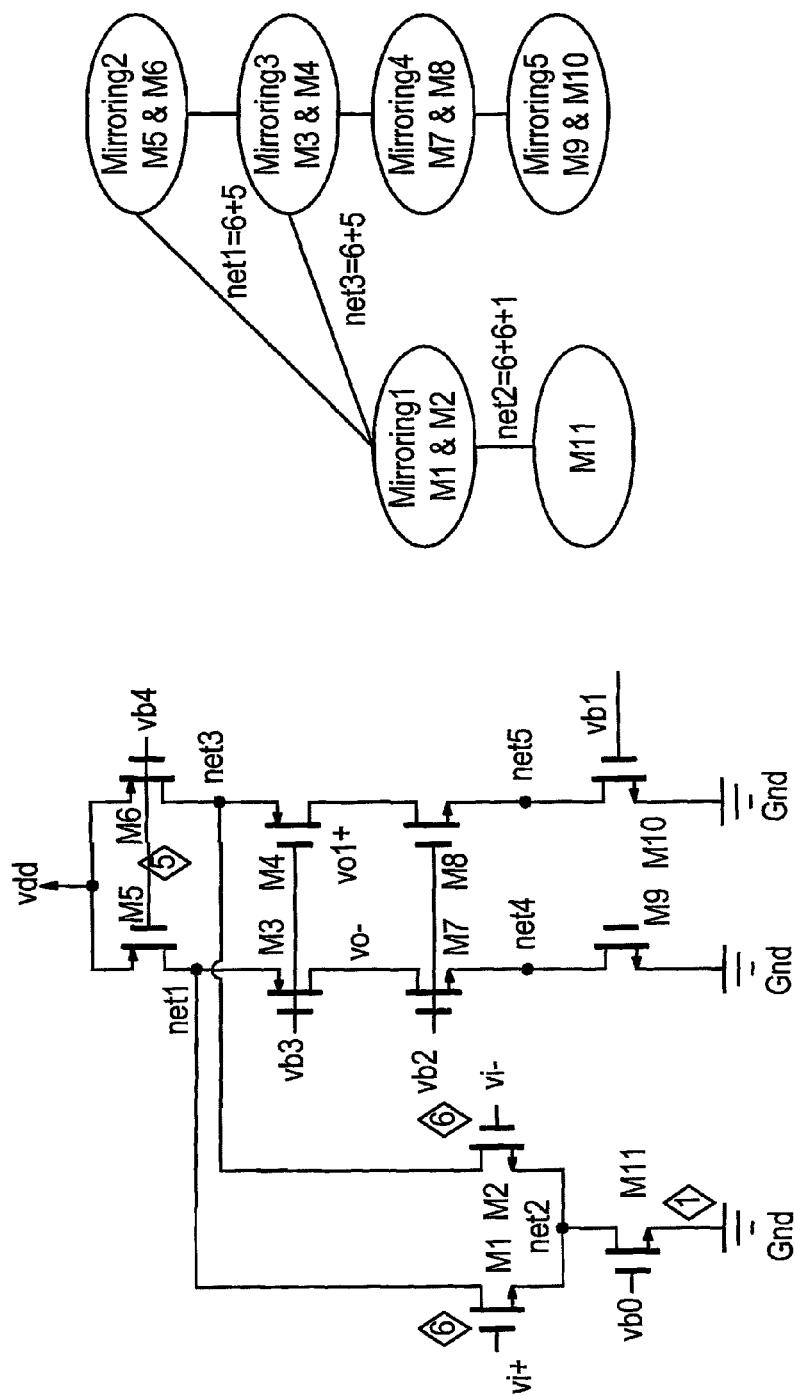
FIG. 12 is a schematic diagram of a wiring symmetry analysis in accordance with an embodiment of the invention.

FIG. 12 is a schematic diagram of a wiring symmetry analysis in accordance with an embodiment of the invention. As shown in FIG. 12, Net2 connects to M1, M2, and M11, with the priorities 6, 6 and 1, and in this case Net2 with a score of 13 higher than the other wires is routed first. Further, Net1, Net3 are a pair of symmetry wires to have the same score, and in this case Net1 and Net3 are routed tandem. Accordingly, the wiring symmetry feature can be maintained.

Figure 13:
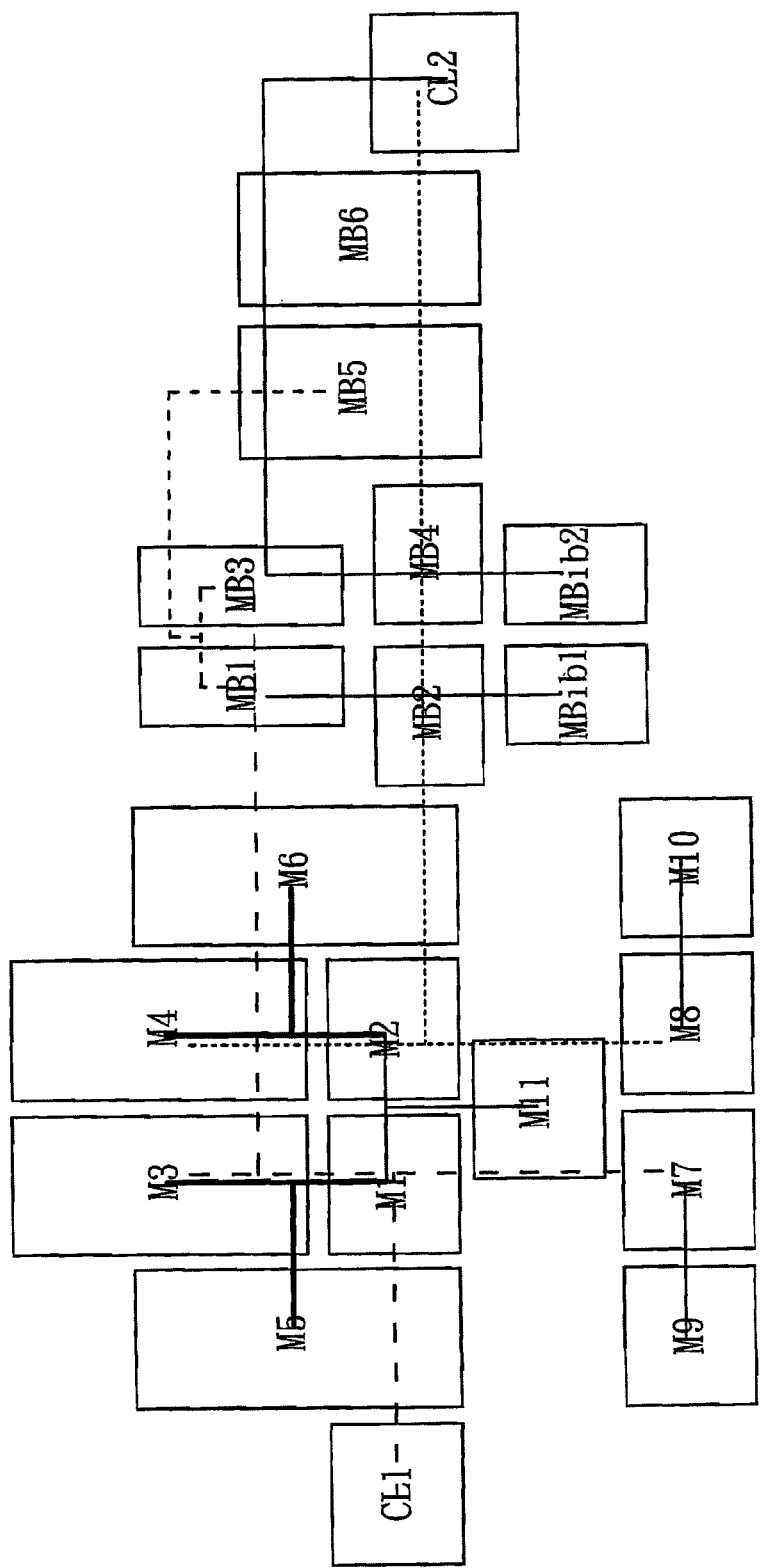
FIG. 13 is a schematic diagram of a result of a layout of FIG. 5 in accordance with an embodiment of the invention.

FIG. 13 is a schematic diagram of a result of a layout of FIG. 5 in accordance with an embodiment of the invention. As shown in FIG. 13, to automate the analog layout generation, a deterministic placement and global routing algorithm in the invention is developed to maintain both the device and wiring symmetry. The prior analog design automation considers only the placement topology among devices and neglects the quality of signal paths impacting on the quality of the analog design automation. The symmetric devices are obviously affected by their signal paths. If the signal paths to the symmetry devices are not symmetric, it will result in signal mismatch and may cause the circuit failure. The invention merges the device folding into shape curve combination thus increasing the flexibility on symmetry.

In view of the foregoing, the contributions of the method for analog placement and global routing include:

1. Considering wiring symmetry: Since the analog layout is quite sensitive to the layout geometry, especially to symmetric devices, not only the device symmetry but also the wiring symmetry should be considered. The wiring symmetry is maintained not only for the routing within symmetric devices but also for the routing among them and their connected devices, thus effectively raising the circuit performance.

2. Placement priority: The device and wiring symmetry and the signal flow in an analog circuit are considered to decide the placement priorities of each device.

3. Measuring wiring symmetry: The simple cost function is defined to reflect wiring symmetry.

4. Utilizing device folding: Device folding allows an analog layout to maintain its physical behavior and the same area, with applying various aspect ratios. We use the device folding to decompose a device of large aspect into small devices of uni-aspect ratio for selecting the optimum folded dimension in placement, thus increasing the flexibility and feasibility on the analog design automation.

Although the present invention has been explained in relation to its preferred embodiment, it is to be understood that many other possible modifications and variations can be made without departing from the spirit and scope of the invention as hereinafter claimed.

What is claimed is:

1. A method for analog placement and global routing considering wiring symmetry, which is executed in a computer to perform a layout for an analog circuit described by a netlist having a set of devices and wires connected thereon, the method comprising the steps of:

(A) inputting the netlist, using the computer, each device of the netlist having a design constraint, each design constraint corresponding to a priority;

(B) establishing a hierarchical constraint tree based on the design constraint and corresponding priority of each device;

(C) performing a sorting on the devices based on the priorities;

(D) performing a placement on each device according to the hierarchical constraint tree, wherein possible shapes of each device are represented by a shape curve;

(E) calculating a corresponding cost function for each placement of the device, and selecting an optimum placement of the device according to the cost functions;

(F) establishing a rectilinear Steiner minimal tree (RSMT) for each wire; and (G) performing an analog routing.

2. The method as claimed in claim 1, wherein the design constraint is selectively to be input, differential, mirroring, matching, proximity, power, and others.

3. The method as claimed in claim 2, wherein the design constraints of input, differential, mirroring, matching, proximity, power, and others have descending priorities of 6, 5, 4, 3, 2, 1 and 0, respectively.

4. The method as claimed in claim 3, wherein for the design constraints with identical priority, an alphabetic order is used to establish a constraint library.

5. The method as claimed in claim 4, wherein the netlist is described in a SPICE format, and the design constraints are annotated into the netlist.

6. The method as claimed in claim 5, wherein a structure of the hierarchical constraint tree is generated based on functionalities of the devices of the netlist.

7. The method as claimed in claim 6, wherein a proximity design constraint in the hierarchical constraint tree covers a mirroring design constraint and a matching design constraint.

8. The method as claimed in claim 7, wherein the shape curve of each device is generated by a device folding.

9. The method as claimed in claim 8, wherein a number of points in each shape curve correspond to a number of feasible folded dimensions.

10. The method as claimed in claim 9, wherein the shape curve is discrete.

11. The method as claimed in claim 10, wherein a force-directed method is used to place each device.

12. The method as claimed in claim 11, wherein step (G) comprises: (G1) performing a wiring symmetry analysis on each wire by using the constraint library to sum all priorities of connected devices to the wire to thereby generate a corresponding routing weight; and (G2) performing the analog routing based on the corresponding routing weight of each wire.

13. The method as claimed in claim 12, wherein step (G) performs the analog routing on the wires by a pattern routing and then by a maze routing on remaining wires which cannot be routed by the pattern routing.

* * * * *